United States Patent [19]

Cox et al.

[11] 4,375,592
[45] Mar. 1, 1983

[54] INCREMENTAL ROTARY ENCODER

[75] Inventors: Gerald L. Cox, Nicholasville; Randall A. Maddox, Georgetown, both of Ky.

[73] Assignee: International Business Machines Corporation, Armonk, N.Y.

[21] Appl. No.: 218,153

[22] Filed: Dec. 19, 1980

[51] Int. Cl.³ ............................................. G01D 5/34
[52] U.S. Cl. ............................................. 250/231 SE
[58] Field of Search ............ 250/231 SE, 237 G, 239; 340/347 P; 356/395

[56] References Cited

U.S. PATENT DOCUMENTS

| 3,098,152 | 7/1963 | Von Mathes | 250/231 SE |
| 3,693,023 | 9/1972 | Wasserman | 250/239 |
| 3,725,902 | 4/1973 | Finnegan | 340/347 P |
| 3,811,056 | 5/1974 | Baba et al. | 250/231 SE |
| 3,997,782 | 12/1976 | Willits | 250/231 SE |
| 4,117,320 | 9/1978 | Tomlinson et al. | 250/237 G |
| 4,190,767 | 2/1980 | Crouse | 250/239 |
| 4,193,199 | 3/1980 | Whitely et al. | 250/231 SE |
| 4,195,938 | 4/1980 | Velazquez | 400/124 |
| 4,268,747 | 5/1981 | Becchi et al. | 250/239 |
| 4,326,128 | 4/1982 | Klein | 250/237 G |

Primary Examiner—David C. Nelms
Attorney, Agent, or Firm—William J. Dick

[57] ABSTRACT

A field replaceable encoder including a slotted housing having a pair of passages therethrough essentially perpendicular to the longitudinal axis of the housing, is attachable to the frame of a machine having a rotatable shaft to which the encoder is to be mounted. Attached to the housing is an accurate stationary mask, the mask having slits which are aligned with the passages in the housing. The mask includes an accurately dimensioned aperture for locating the mask, and thus the housing, on a bearing on the rotatably mounted shaft. A pair of light sources and a pair of light detectors are mounted on opposite sides of the housing aligned with the passages and slits in the mask. A hub, to which is attached a rotating disc, is connected to the rotating shaft, the disc being mounted in the slotted housing so that interdigitated opaque and transparent portions align with the slits of the mask, and thus the light sources and light detectors. In the preferred embodiment, the light sources are mounted in the passages (tunnel like in formation) which converge at their outlets and which prevents having to employ collimated light sources while inhibiting cross-talk between the detectors and adjacent sources allowing for close spacing of the source pair and the detector pair.

2 Claims, 7 Drawing Figures

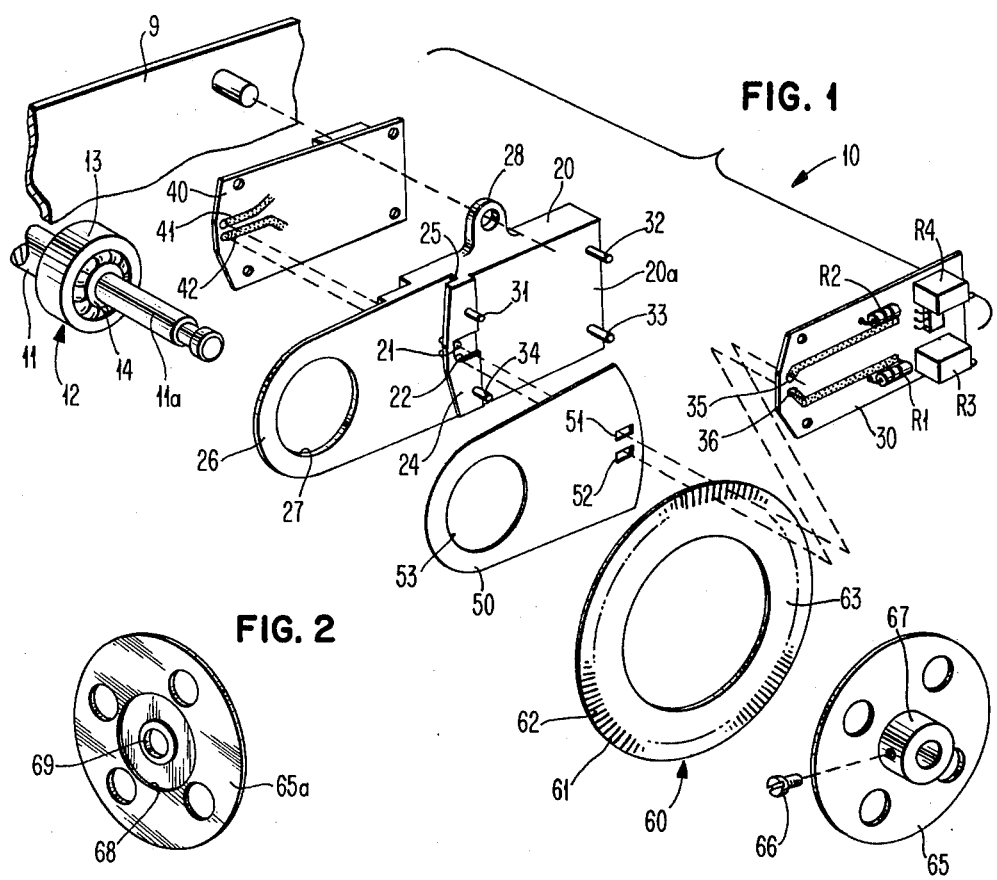
FIG. 1
FIG. 2
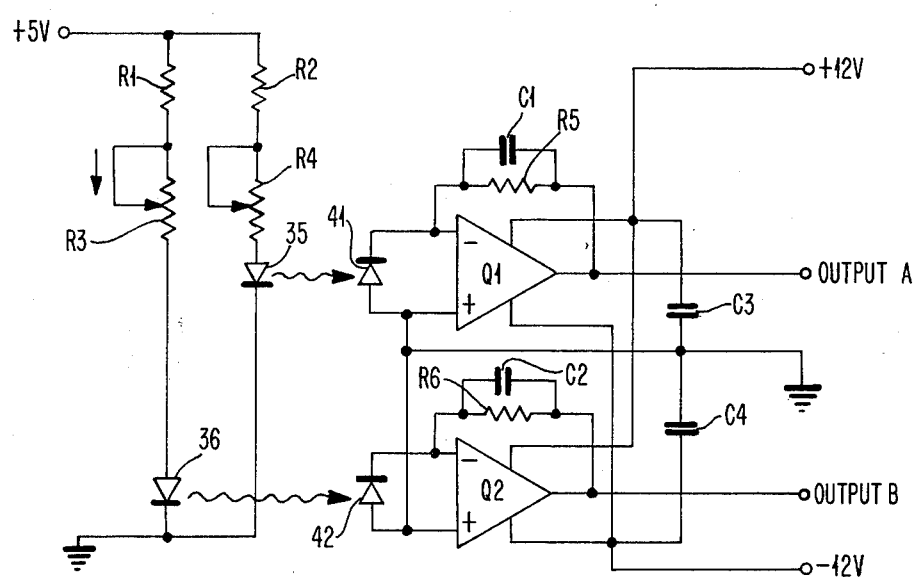
FIG. 3

INCREMENTAL ROTARY ENCODER

SUMMARY OF THE INVENTION AND STATE OF THE PRIOR ART

The present invention relates to an incremental rotary encoder, and more specifically relates to such an encoder which is field replaceable and which requires no special adjustment techniques to effect alignment.

Most commercial encoders require that the phase of a two channel incremental rotary encoder be adjusted in the field or that the mask and disc patterns be prealigned at the factory. In either instance, the alignment of the two patterns is time consuming and costly and field installation is laborious. For example, certain encoders have the disc prealigned to the hub by an optical comparator and the mask pattern is then aligned to the disc pattern using a reference shaft and V block. Field installation then requires the following procedure:

(1) Locate the V block on the machine shaft;
(2) Use a shim to set a predetermined gap between the mask and the disc;
(3) Lock the mask and the housing to the stationary machine member; and
(4) Remove and discard the V block.

There are numerous encoders exemplified in the prior art which lend themselves to field replacement, but without the attendant advantages of the present invention, which advantages are hereinafter enumerated. This prior art includes, but is not limited to, the following U.S. Pat. Nos.: 3,693,023; 3,725,902; 3,811,056; 3,997,782; 4,117,320; 4,190,767; and 4,195,938. While all of the foregoing patents are relevant to incremental rotary encoders, each of them discloses apparatus which has one or more of the following deficiencies: The systems employed are not forgiving so that eccentricity and alignment errors cause excessive phase errors; the system design of the apertures are such that spacing between the mask and the disc is critical; and the stationary mask pattern is not referenced during its manufacture to an accurate machine part in order to eliminate adjustments between mask and disc.

Accordingly, it is a principle object of the present invention to provide a two channel incremental rotary encoder in which phase adjustments are unnecessary either upon initial manufacture or during field replacement.

Another object of the present invention is to provide an incremental rotary encoder in which field installation and replacement, when necessary, is simplified.

Yet another object of the present invention is to provide an incremental rotary encoder with a high performance to cost ratio and one in which the disc and hub assemblies are compatible with all mask and housing assemblies such that the various parts may be replaced without having to replace the whole unit, if such is desired, and without any in field adjustments.

In the present instance, these functions are accomplished by the incremental encoder of the present invention. The encoder is situated intermediate the frame of the machine and a rotatably mounted shaft on the machine. The encoder comprises a housing including a pair of closely adjacent passages therethrough. A pair of light sources is aligned with the passages and on one side of the housing and a pair of light detectors is mounted on the opposite side of the housing and aligned with the passages. A slot is defined intermediate the pairs of light sources and light detectors and a mask having a pair of slits aligned with the passages is fixedly mounted on the housing. The mask includes means for locating it relative to the rotatably mounted shaft and therefore also locating the housing relative to the shaft. Tunnels having converging narrow openings confront the mask for receiving one of the pairs of light detectors and light sources. A disc, having interdigitated opaque and transparent portions adjacent the periphery thereof, is mounted on a hub for mounting on the rotatable shaft in the slot so that the opaque and transparent portions align with the passages.

Other objects and a more complete understanding of the invention may be had by referring to the following specification and claims taken in conjunction with the accompanying drawings.

DRAWING DESCRIPTION

FIG. 1 is an exploded perspective view of an incremental rotary encoder constructed in accordance with the present invention;

FIG. 2 is a perspective view of one portion of the encoder illustrated in FIG. 1 and showing the reverse side thereof;

FIG. 3 is a schematic electrical diagram illustrating typical circuitry which may be connected to the incremental rotary encoder of the present invention;

Figure 6:
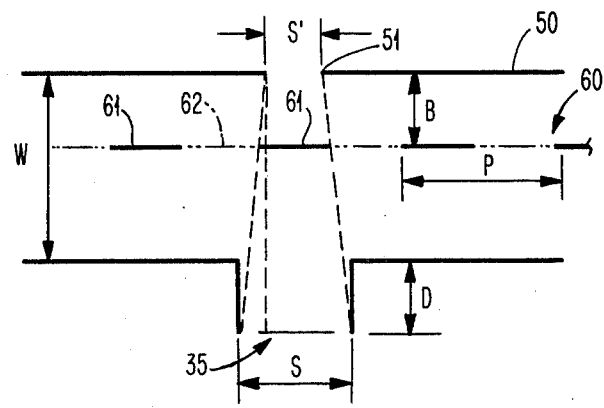
Figure 7:
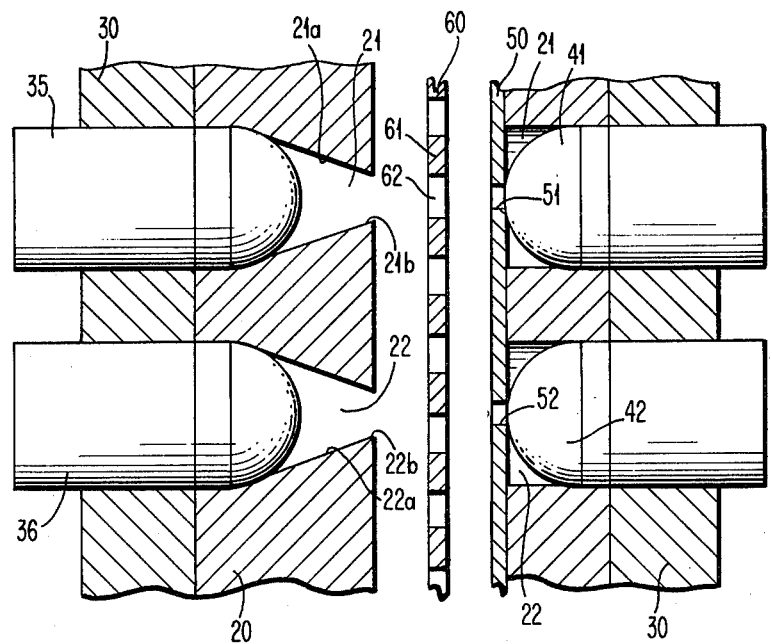

FIG. 6 is a schematic diagram illustrating the relationship of the mask, rotating disc and source width in the housing of the incremental rotary encoder of the present invention to eliminate sensitivity of the system to disc wobble and disc placement within the slot; and FIG. 7 is an enlarged fragmentary sectional view through a portion of the apparatus of the present invention illustrating the relative positions of certain of the parts to facilitate construction thereof.

Referring now to the drawing, and more specifically FIG. 1 thereof, an incremental rotary encoder 10, constructed in accordance with the present invention, is illustrated therein.

The rotary encoder of the present invention is adapted for attachment intermediate the frame 9 of a machine (not shown) and a rotatably mounted shaft 11 on the machine, which shaft 11 may be connected to a machine part which is to be moved at a predetermined velocity or velocities and for which the position of the part must be accurately determined. For example, the incremental rotary encoder of the present invention may be employed in connection with a printer or typewriter having a moving carrier or carriage in which it is desirable to determine which direction the carrier is moving and its exact position at any one time. However, it should be recognized that the encoder of the present invention may be employed with any machine having a rotatable shaft and wherein it is desired to monitor some dynamic parameter of the shaft or apparatus connected thereto.

The encoder of the present invention comprises a support housing 20 including a pair of closely adjacent passages 21 and 22 therethrough on a radius of curvature with respect to the shaft 11. Means, in the present instance a light emitting diode driver board 30, is adapted for mounting on one side of the housing as by pins 31, 32, 33 and 34 to position light sources, in the present instance light emitting diodes 35 and 36, in the passages 21 and 22 (see FIG. 7). On the opposite side of the housing 20 is a second circuit board 40 which includes a pair of light detectors 41 and 42 for alignment with the passages 21 and 22 to receive light from the light sources 35 and 36 as hereinafter described.

In order to accurately space the light sources and detectors one from the other but still maintain alignment of the same relative to the passageways 21 and 22, means defining a slot intermediate the pairs of light sources and light detectors is provided. To this end, and as best illustrated in FIG. 1, the side 20a of the housing 20 mounting the light source circuit board 30 includes a shelf or projecting ledge 24 to define a slot 25 between the ledge 24 and an extended projection 26 of the housing 20. A mask 50 includes a pair of slits 51 and 52 adapted to be aligned with the passageways 21, 22. The slits have a narrower opening than the width of the passages 21 and 22, and the mask 50 is adapted for fixed mounting on the projection 26 associated with the housing.

The key to proper mounting of the whole assembly is the mask 50. To this end, the mask includes means for locating the mask relative to the rotatably mounted shaft and inasmuch as the mask is fixedly moununted on the projection 26 of the housing 20, it also aligns the various parts on the housing to the shaft 11. To this end, the means for assuring proper location of the mask 50 and thus the housing is an aperture 53 in the mask which aligns with an aperture 27 in the projection 26 and which is snugly fittable over shaft support means, in the present instance the outer race 13 of a bearing 12 mounted in the machine frame 9. The outer race 13 of the bearing 12 is connected to the machine frame 9 to inhibit rotation thereof while the inner race 14 of the bearing 12 is coupled to the shaft 11 to effect rotation therewith. The relationship between the size or diameter of the aperture 53 to the outer race 13 diameter of the bearing 12, is that the aperture 53 is preferably equal in size or slightly smaller than the diameter of the outer race 13 of the bearing 12 while the aperture 27 associated with the projection 26 of the housing 20 is slightly larger. Accordingly, both the mask and the extension are adapted for coactive alignment with the shaft support, but the mask aperture 53 is dimensioned for abutting engagement with the bearing to act as a system reference. Thus once the mask 50 is mounted on the projection 26 of the housing 20, as by epoxy or the like, with the slits 51 and 52 in alignment with the passages 21 and 22, the aperture 53 of the mask assures the proper alignment of the housing.

The system is independent of the circumferential position of the housing 20 with respect to the leadscrew or shaft 11. Thus the housing may be fastened as through the tab 28 to the machine frame 9 at any convenient location.

In order to permit counting to determine the exact location of the device or other part connected to the leadscrew or shaft 11 and the direction of rotation thereof, mounted on a shaft extension 11a through the inner race 14 of the bearing 12, is a rotatable disc 60 adapted for rotation relative to the housing 20 and with its peripheral portion within the slot 25. Aligned in the slot with the passages 21 and 22, are interdigitated opaque and transparent portions 61 and 62 respectively positioned adjacent the periphery of the disc, the portions being in alignment with the slits 51 and 52 and the passageways 21 and 22. Preferably the spacing of the opaque and transparent portions 61 and 62 with respect to the spacing of the passages 21, 22 is such that there is a 90° phase difference between the two so that direction of rotation may easily be detected in a conventional manner. (See for example, U.S. Pat. No. 4,180,703, issued on Dec. 25, 1979.) In this connection, the central portion 63 of the disc 60 is adapted for connection to a hub 65, as by epoxy resin or the like. The hub 65 may be connected to the shaft extension as by a set screw 66 which extends through the extended collar 67 of the hub. The interior face 65a of the flange (FIG. 2) of the hub 65 which is adapted to receive the central portion 63 of the disc 60, preferably includes a recessed portion 68 having a greater diameter than the diameter of the outer race 13 of the bearing 12. An annular projection 69 extends from the recessed portion 68 for confronting engagement with the surface of the inner race 14 of the bearing 12.

The general approach taken in this invention to provide a field replaceable encoder which requires no field adjustments is to solve the phase adjustment and field replacement problems in the initial manufacture. One of the first aspects of the invention is to make the system forgiving so that eccentricity and alignment errors do not cause large phase errors which would conventionally "fool" the system and inhibit normal machine operation.

Considering first the eccentricity problem in field replaceable incremental rotary encoders, eccentricity is reflected as radial shifts in the opaque and transparent portions 61 and 62 of the rotating disc relative to the slits 51 and 52 located in the passages 21 and 22. The eccentricity of the disc 60 as it rotates may be due to several factors: (1) shaft 11, 11a to bearing 12 total indicator reading; (2) disc 60 to hub 65 mounting (non-concentric mounting); (3) hub 65 to shaft 11a eccentricity; (4) the tolerance of the disc 60 aperture or hole and the disc pattern concentricity.

Figure 4:
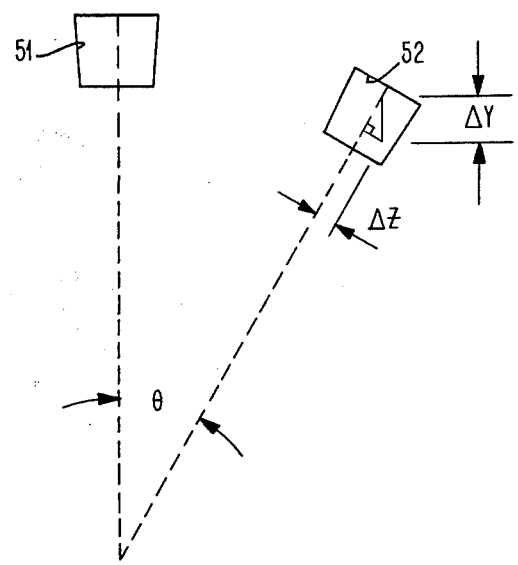
FIG. 4 is a schematic diagram to illustrate the problems of eccentricity and how the apparatus of the present invention overcomes the same.

Referring first to FIG. 4, in order to reduce phase errors due to such eccentricity, it is necessary to make the radius R of the disc large (within inertia and space constraints) and make the angle $\theta$ between the slits 51 and 52 (or passages 21, 22) of the mask 50 small. For example, if due to eccentricity, the disc pattern moves by $\pm \Delta y$ relative to the mask apertures or slits 51, 52, $\Delta Z = \Delta y \sin \theta$ and the phase error may be expressed by the following equation:

$$\text{phase error} = \frac{\Delta Z}{P}(360°) = \pm \frac{360 N \Delta y \sin \theta}{2\pi R} \text{ degrees}$$

where:
P = period for one line pair = $2\pi R/N$
N = No. of line pairs per disc 60 revolution
$\theta$ = angular separation between sensors 41, 42 or slits 51, 52
R = disc 60 radius
$\Delta y$ = runout = 2E (eccentricity)
[It should be noted that this equation applies to circumferentially disposed sensors and slits. Radially stacked sensors, i.e., sensors in a different radial position, will cause larger phase errors for an equivalent runout or eccentricity.]

As an example of typical dimensions, N=240, R=1.25" (31.75 mm), $\theta$=4.125° and $\Delta y$=0.007Δ. Accordingly, utilizing the phase error equation given above, the phase error of the example system is ±5.54°. By making the angle θ small the system becomes relatively insensitive to eccentricity and the alignment of the disc 60 to the hub 65 becomes far less critical. For example, a simple mechanical tool containing a tapered pin for centering the disc 60 to the hub 65 may be employed. This signficantly reduces the labor when compared to techniques requiring optical comparators for such alignment.

The disadvantage of making the angle θ small is that cross talk between the channels or sensors 41 and 42 may become severe. To overcome this problem, many prior art devices employ lenses to collimate the light sources and attempt to accurately control a small gap between the mask 50 and the rotating disc 60. However, it is very difficult to effectively collimate and control a finite source light source with a short focal length lens. Additionally, with prior art devices the small gap between disc and mask must be set in the field by shims, and all disc wobble eliminated. These requirements add cost to the overall system.

Figure 5:
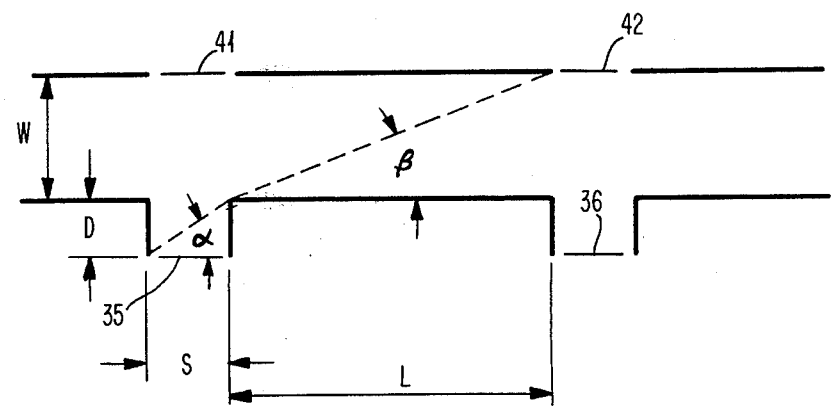
FIG. 5 is a schematic representation of the means by which cross-talk between adjacent channels is inhibited as by the incremental rotary encoder of the present invention.

In accordance with a feature of the present invention, the approach to resolving the cross talk problem is to recess the light sources, in the present instance the LED's 35 and 36, in a tunnel portion 21a, 22a of the passages 21 and 22 respectively. As shown in FIG. 7 the tunnels have coverging side walls that terminate in slits 21b, 22b respectively. The effect of recessing the light sources and forming a tunnel with converging sidewalls is best illustrated in the schematic diagram of FIG. 5. By placing the sources in a tunnel with converging side walls, the dependence on the angular radiation pattern of a source and lens is thereby eliminated. Referring now to FIG. 5, to guarantee that photodiode 42, for example, is vignetted from the light source 35, $$\alpha > \beta \text{ or } \tan^{-1}\frac{D}{S} > \tan^{-1}\frac{W}{L}$$

$$\text{therefore, } D > \frac{SW}{L}$$

where
D = depth of source 35 recess
S = slit (21b,22B) width for source
W = slot 25 width for disc 60
L+S = spacing between passage centerlines
It should be noted that the spacing between the channel or passage centerlines must equal (2n+3)/4 line pairs to guarantee phase quadrature (n=an integer). However, prior to selecting values for D, S, W and L, it is necessary to complete the design of other apertures in the system, notably the slits 51 and 52 of the mask 50.

In order to eliminate the sensitivity of the system to disc 60 wobble and axial placement of the disc within the slot 25 (FIG. 7), it should be guaranteed that regardless of the axial location of the rotating disc, light from neither of the light sources 35 or 36 should strike photodiodes 41 and 42 when the opaque portion 61 of the rotating disc pattern is centered within the stationary mask 50 slit 51. FIG. 6 illustrates one portion of the mask, rotating disc and light source 35 in a position where the light detector 41 is shadowed from light detection by the opaque portion 61 of the disc 60. By similar triangles $$\frac{W+D}{\frac{S}{2}-\frac{S'}{2}} = \frac{B}{\frac{P}{4}-\frac{S'}{2}}$$

$$\text{solving, } S' \leq \frac{\frac{P}{2}(W+D) - BS}{W+D-B}$$

S' = mask 50 slit 51, 52 width
B = distance between disc 60 and mask 50
P = disc pattern period
S = effective source width (housing)
D = tunnel depth
By iteration, values for slot 25 width (W) for the disc 60, depth (D) of the lamp 35, 36 recess, distance (B) between disc and mask patterns, the slit 21b, 22b width (S) associated with the tunnels 21a, 22a of the passages 21, 22 and the spacing (L+S) between the channel center lines may be determined. These values can satisfy requirements on cross talk, phase quadrature and the field stop ability of the mask 50. By further iteration the values for the slot 25 width (W) for the disc 60, depth (D) of lamp 35, 36 recess and the slit width (S) for the source, (FIG. 5), which yields a nearly constant value for the mask 50 slit 51, 52 width (S') even when the distance (B) between the disc 60 and the mask 50 patterns, (FIG. 6) varies considerably, may be determined. Thus phase adjustment in the design is eliminated by designing the phase between the channels into the accurate mask pattern.

By accurately stamping a reference mounting hole such as the aperture 53 within the mask 50 which aperture mounts securely around the outer race of the tightly controlled leadscrew bearing 12, mask 50 to disc 60 alignment is insured. In the preferred mode, the stationary mask is made from photographic film because it is an inexpensive process with high pattern accuracy and because the reference mounting hole or aperture 53 may be easily located and stamped concentric with the pattern. Thus, for example, the marking for the hole location may be part of the mask pattern for the slits 51 and 52 on the photographic mask.

The incremental rotary encoder of the present invention typically generates two analog voltage signals which may be processed to obtain velocity and position data of the leadscrew or rotatable shaft 11. The two channels operate at phase quadrature (90° phase difference) to allow direction sensing for virtually any useable shaft velocity.

Referring now to the schematic diagram of the circuit of FIG. 3, the light sources such as LEDs 35 and 36 mounted on the LED driver board 30 are each series connected through potentiometers R3, R4 and current limiting resistors R1 and R2 to a power source, for example 5 volts. The potentiometers R3 and R4 may be employed to adjust the LED current for the desired output signal voltage. The photosensors 41 and 42 which are mounted behind the stationary mask 50 (see FIG. 7) receive incident light and convert the light into a photocurrent. The rotating disc 60, as has heretofore been described, contains the radial, circumferentially extending pattern of alternating opaque and transparent portions 61 and 62. The operational amplifiers Q1 and Q2 are respectively connected to the photosensors 41 and 42 and convert the photocurrent into an output signal voltage labeled output A and output B respectively. As the disc 60 rotates between the light sources 35 and 36 and the photodetectors 41 and 42, the amplifiers Q1 and Q2 provide signal voltages which are at phase quadrature. Waveforms for steady state operation may vary from trapezoidal to quasi-sinusoidal. As is conventional or well known in the art, these analog signals may then be digitized and used to increment or decrement position counters. Absolute linear positional data requires that the counters be initalized and that there exist a correspondence between shaft position and the work piece or carrier carried by or driven by the shaft or leadscrew 11.

The resistors R5 and R6, as is conventional, are feedback resistors for the operational amplifiers Q1 and Q2 respectively. The capacitors C1 and C2, in a conventional manner, operate to reduce high frequency (for example >6 kilohertz) current noise, while capacitors C3 and C4 are power supply by-pass capacitors. Typical power supply voltages of ±12 volts are illustrated.

A typical table of values is set forth below for the circuit illustrated in FIG. 3.

| Component | Description |
|---|---|
| R1 | 62Ω ± 5%, ½ watt |
| R2 | 62Ω ± 5%, ½ watt |
| R3 | 2KΩpot ± 5%, .6 watt |
| R4 | 2KΩpot ± 5%, .6 watt |
| R5 | 4.7MΩ ± 5%, ¼ watt |
| R6 | 4.7MΩ ± 5%, ¼ watt |
| C1 | 4.7pf ± 10%, ceramic |
| C2 | 4.7pf ± 10%, ceramic |
| C3 | .01μf ± 10%, mylar |
| C4 | .01μf ± 10%, mylar |
| 35 | IRLED |
| 35 | IRLED |
| 41 | photodiode |
| 42 | photodiode |
| Q1,Q2 | dual BiMos op-amp 8 pin mini DIP |

The manner in which a clean waveform may be established for purposes of digitizing the signal to obtain a count for positioning of elements carried by the leadscrew or shaft 11 is set forth in U.S. Pat. No. 4,180,704. It should be recognized that the circuit described therein, however, as well as the circuit heretofore described relative to the incremental encoder of the present invention may be optimized for different parameters as suited for the particular equations set forth above.

Accordingly, the design of the present invention allows for quick field replacement because of the lack of need for adjusting, either in the field or at the factory, for phase. Thus all disc and hub assemblies are compatible with all mask and housing assemblies allowing for simple factory alignment of the disc to the hub and simple field replacement of the various parts or of the unit.

Although the invention has been described with a certain degree of particularity, it is understood that the present disclosure has been made only by way of example and that numerous changes in the details of construction and the combination and arrangement of parts may be made without departing from the spirit and scope of the invention as hereinafter claimed.

What is claimed is:

1. An incremental encoder for attachment intermediate the frame of a machine and a rotatably mounted shaft, said encoder comprising:

a housing including at least a pair of closely adjacent circumferentially spaced apart passages therethrough;

said passages each including converging sidewall tunnel like portions terminating in a narrow opening;

means for mounting a pair of light sources in said passages recessed from said narrow openings and means for mounting a pair of light detectors aligned with said passages and positioned to receive light from said sources;

means defining a slot intermediate said pairs of light sources and light detectors;

a mask having a pair of slits aligned with said passages, said slits having a narrower opening than the width of the narrow opening of said passages, a bearing on said shaft, said bearing having inner and outer races, said outer race being connected to said machine frame to inhibit rotation thereof and said inner race being coupled to said shaft to effect rotation therewith said mask fixedly mounted on said housing, and means on said mask for locating said mask on the outer race of said bearing;

said passages positioned in said housing for confronting said mask;

a disc having interdigitated opaque and transparent portions adjacent the periphery thereof, and hub means for mounting said disc thereon, said hub means including an annular projection thereon for engagement with the inner race of said bearing to axially position said disc relative to said mask, and means for connecting said hub to said shaft for aligning said opaque and transparent portions with said passages in said slot.

2. An incremental rotary encoder in accordance with claim 1 wherein said hub means includes a radially projecting flange including a recessed portion having a greater diameter than the diameter of said outer race of said bearing.

* * * * *